US012707606B2

(12) United States Patent
Shirosaka et al.

(10) Patent No.: US 12,707,606 B2
(45) Date of Patent: Aug. 11, 2026

(54) ELECTRICAL JUNCTION BOX AND WIRE HARNESS

(71) Applicant: YAZAKI CORPORATION, Tokyo (JP)

(72) Inventors: Kazuki Shirosaka, Kakegawa (JP); Hideki Mizuno, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 248 days.

(21) Appl. No.: 18/658,944

(22) Filed: May 8, 2024

(65) Prior Publication Data

US 2024/0389278 A1 Nov. 21, 2024

(30) Foreign Application Priority Data

May 15, 2023 (JP) ................................ 2023-079768

(51) Int. Cl.

*H05K 7/20* (2006.01)
*B60R 16/02* (2006.01)
*B60R 16/023* (2006.01)

(52) U.S. Cl.

CPC ..... *H05K 7/20854* (2013.01); *B60R 16/0207* (2013.01); *B60R 16/0239* (2013.01); *H05K 7/2049* (2013.01); *H05K 7/20509* (2013.01)

(58) Field of Classification Search

CPC ............. H01M 50/271; H01M 50/289; H01M 50/224; H01M 50/233; H01M 50/262; H01M 50/593; H10W 74/00; H10W 90/00; H10W 40/778; H10W 90/736; H10W 40/611; H10W 72/877; H10W 72/00; H10W 40/255; H10W 40/625; H10W 40/037; H10W 76/15; H10W 72/07251; H10W 72/926; H10W 40/258; H10W 40/641; H10W 72/50; H10W 70/65; H10W 74/114; H05K 7/20509; H05K 7/2039; H05K 7/20772; H05K 7/20254; H05K 7/209; H05K 1/181; H05K 7/2049;

(Continued)

(56) References Cited

U.S. PATENT DOCUMENTS 5,065,283 A * 11/1991 Adachi ................ H05K 1/0263 439/84
6,411,516 B1 * 6/2002 Palumbo .............. H05K 1/0204 29/890.032

(Continued)

FOREIGN PATENT DOCUMENTS

| | | |
|---|---|---|
| JP | 2006-87173 A | 3/2006 |
| JP | 2017-152441 A | 8/2017 |
| JP | 2021-153362 A | 9/2021 |

*Primary Examiner* — Michael A Matey
(74) *Attorney, Agent, or Firm* — KENEALY VAIDYA LLP

(57) ABSTRACT

An electrical junction box includes a heat generating component (a relay and a bus bar) and a cooling unit that cools the heat generating component. The cooling unit includes: a metal cooling plate; a heat transfer member having insulating properties and intervening between the bus bar of the heat generating component and the metal cooling plate; and a spacer having insulating properties, being in contact with the bus bar of the heat generating component and the metal cooling plate, and maintaining a predetermined interval between the heat generating component and the metal cooling plate.

5 Claims, 4 Drawing Sheets

(58) Field of Classification Search

CPC ..... H05K 2201/10272; H05K 7/20854; H05K 3/0061; H05K 7/14329; H05K 7/20436; H05K 5/0247; H05K 1/0306; H05K 7/1427; H05K 2201/042; H05K 7/06; H05K 9/0015; H05K 9/0018; G06F 1/206; G06F 13/00; B60R 16/0239; B60R 16/0207; B60R 16/0215; H02G 3/081; H02G 3/03; H02G 3/08; H02G 5/08; H02G 5/10; H02G 3/14; H01G 2/08; H01G 4/224; H01G 2/10; H01G 11/78; H02M 7/003; H02M 3/003; B60L 58/26; F28D 15/0233; F28D 15/00; F28D 2021/0028; F25B 2321/023; F28F 21/00; F28F 2225/04; F28F 2240/00; F28F 3/00; F28F 9/00; F24F 1/24; H01F 27/022; H01F 27/025; H01F 27/06

See application file for complete search history.

(56) References Cited

U.S. PATENT DOCUMENTS 9,763,317 B2 * 9/2017 Mass .................... B23K 1/0016
10,038,315 B2 * 7/2018 Sumida .................... H02G 3/16
10,117,322 B2 * 10/2018 Chin ........................ B60R 16/02
10,504,813 B2 * 12/2019 Davare ................ H05K 1/0204
10,576,912 B2 * 3/2020 Haraguchi ............... H05K 7/06
2004/0037057 A1 * 2/2004 Okada .................. H05K 1/0206 257/E23.105
2012/0326292 A1 * 12/2012 Ohashi ................ H10W 40/228 257/690
2015/0029674 A1 * 1/2015 Ko ....................... H05K 1/0204 361/720
2017/0047720 A1 * 2/2017 Kobayashi ............... H02G 3/16
2018/0027646 A1 * 1/2018 Sumida ................ H05K 1/0204 361/720
2021/0057895 A1 * 2/2021 Takamizawa ........ H05K 3/4046
2022/0183140 A1 * 6/2022 Uchida .................. H05K 7/205
2022/0408545 A1 * 12/2022 Haraguchi ........... H05K 1/0204
2023/0123936 A1 4/2023 Komaki

* cited by examiner (UPPER SIDE)
(LOWER SIDE)
WH
10
W
8
1B
1A
1 (11)
2B
2Bb
2 (11)
2A
2Aa
2Ab
4b
4 (12)
4a
3 (12)
3a
X
Y
Z (UPPER SIDE)
(LOWER SIDE)
10
1 (11)
1A
1Aa
1B
2 (11)
2A
2Aa
2Ab
2B
2Bb
3 (12)
3a
3b
4 (12)
4a
4c
4c
5
5 (12)
8
T1
T2
X
Y
Z (UPPER SIDE)
(LOWER SIDE)
10
1 (11)
1A
1Aa
1B
2 (11)
2A
2Aa
2Ab
2B
2Bb
3 (12)
3a
3b
4 (12)
4a
4c
4c
5
5 (12)
8
T1
T2'
X
Y
Z

ELECTRICAL JUNCTION BOX AND WIRE HARNESS

CROSS-REFERENCE TO RELATED APPLICATION(S)

The present application claims priority to and incorporates by reference the entire contents of Japanese Patent Application No. 2023-079768 filed in Japan on May 15, 2023.

BACKGROUND OF THE INVENTION

1. Field of the Invention

The present invention relates to an electrical junction box and a wire harness.

2. Description of the Related Art

Conventionally, for example, Japanese Patent Application Laid-open No. 2021-153362 A discloses an electrical junction box having a configuration in which heat from a relay and a bus bar is transferred to a housing case by using a heat transfer sheet. In the electrical junction box, a holder that protrudes toward the heat transfer sheet and holds the bus bar with the heat transfer sheet intervening therebetween is provided on the bottom plate of the housing case.

In addition, conventionally, for example, Japanese Patent Application Laid-open No. 2006-087173 A discloses an electrical junction box including a heat transfer plate that cools a relay and a bus bar. This electrical junction box includes an attachment boss for attaching a heat transfer plate to a case by using an attachment screw.

Here, in the electrical junction box, close contact of the heat generating component and the heat transfer member are required to cool the heat generating component. However, when the heat transfer member and the heat generating component are pressed against each other, the heat transfer member is compressed and crushed, and this leads to difficulty in maintaining an insulation distance.

SUMMARY OF THE INVENTION

The present invention has been made in view of the above circumstances, and an object of the present invention is to provide an electrical junction box and a wire harness that can appropriately have cooling performance.

In order to achieve the above mentioned object, an electrical junction box according to one aspect of the present invention includes a heat generating component; and a cooling unit configured to cool the heat generating component, wherein the cooling unit includes: a metal cooling plate; a heat transfer member having insulating properties and intervening between the heat generating component and the metal cooling plate; and a spacer having insulating properties, being in contact with the heat generating component and the metal cooling plate, and maintaining a predetermined interval between the heat generating component and the metal cooling plate.

In order to achieve the above mentioned object, a wire harness according to another aspect of the present invention includes a wiring member having electrical conductivity; and an electrical junction box electrically connected to the wiring member, wherein the electrical junction box includes a heat generating component, and a cooling unit configured to cool the heat generating component, and the cooling unit includes: a metal cooling plate; a heat transfer member having insulating properties and intervening between the heat generating component and the metal cooling plate; and a spacer having insulating properties, being in contact with the heat generating component and the metal cooling plate, and maintaining a predetermined interval between the heat generating component and the metal cooling plate.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the drawings. Note that this invention is not limited to the embodiment. Constituent elements in the following embodiment include those that can be easily replaced by a person skilled in the art or those that are substantially the same.

In the following description, three directions intersecting one another are referred to as a “length direction (first direction) X”, a “width direction (second direction) Y”, and a “height direction (third direction) Z” for convenience. Here, the length direction X, the width direction Y, and the height direction Z are orthogonal to one another. Typically, the length direction X and the width direction Y correspond to a horizontal direction. Typically, the height direction Z corresponds to the vertical direction. A “vertically upper side”, “vertically upward”, or “vertically above” is referred to as an “upper portion”, an “upper side”, “upper”, “upward”, or “above”, and a “vertically lower side”, “vertically downward”, or “vertically below” is referred to as a “lower portion”, a “lower side”, “lower”, “downward”, or “below”.

Figure 1:
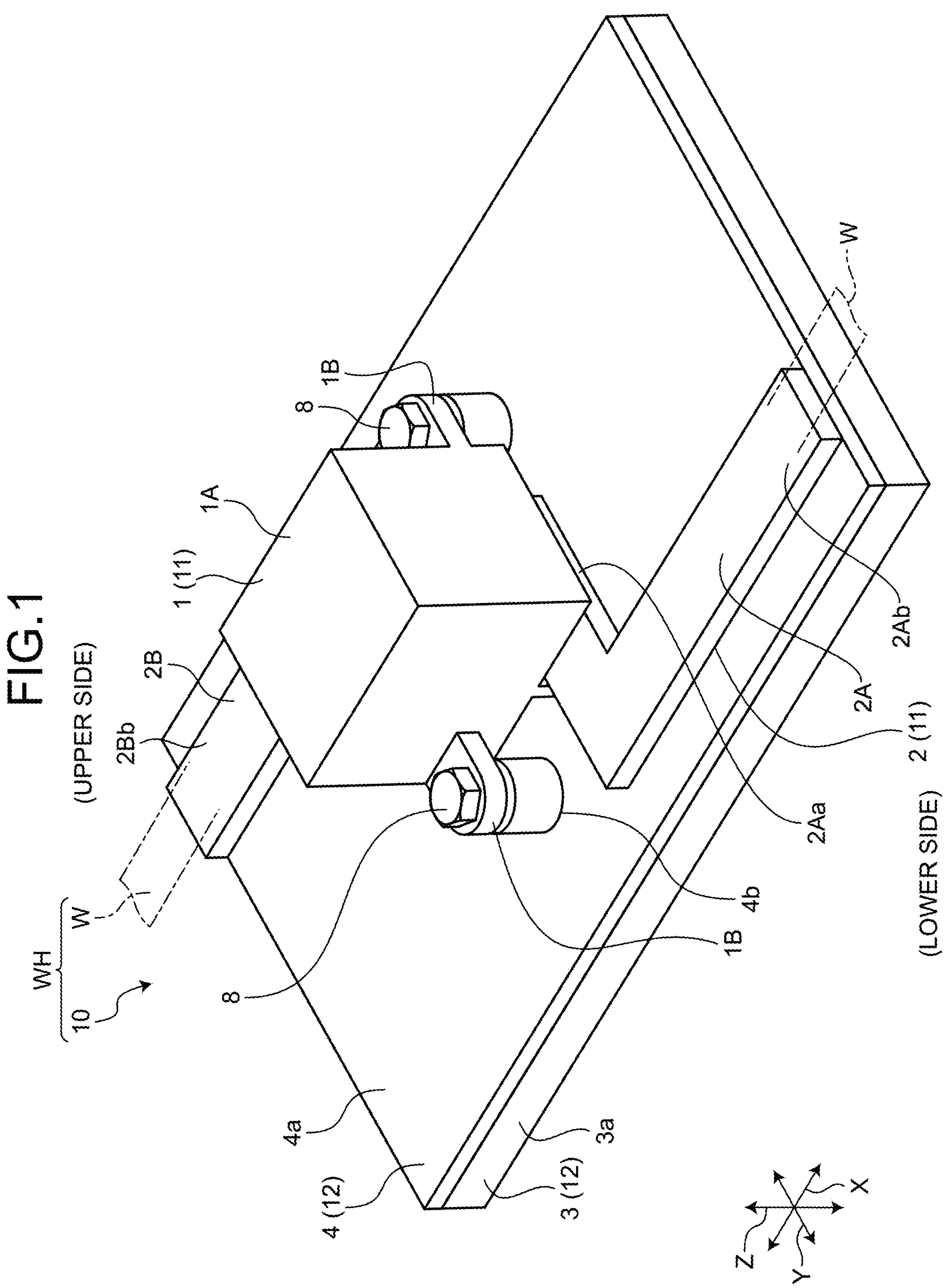
FIG. 1 is a perspective view of an electrical junction box and a wire harness according to an embodiment.

An electrical junction box 10 of the embodiment is mounted on a vehicle such as an automobile and incorporated in a wire harness WH as illustrated in FIG. 1. The wire harness WH is, for example, a member connects a plurality of wiring members W used for power supply and signal communication to devices mounted on a vehicle by a connector or the like to connect the devices to each other. The wire harness WH includes the wiring member W having electrical conductivity and the electrical junction box 10 electrically connected to the wiring member W. The wiring member W is formed of, for example, a metal rod, an electric wire, an electric wire bundle, or the like. The metal rod is formed by covering an outer side of an electrically conductive rod-shaped member with an insulating covering portion. The electric wire is formed by covering an outer side of a conductor (core wire) including a plurality of electrically conductive metal element wire with an insulating covering portion. The wire harness WH may further include a grommet, a protector, a fastener, and the like.

The electrical junction box 10 collectively houses therein electronic components such as a connector, a fuse, a relay, a capacitor, a branch portion, an electronic control unit, and an electronic component unit obtained by unitizing these components. The electrical junction box 10 is installed, for example, in an engine room of a vehicle or a vehicle cabin. The electrical junction box 10 is connected between a power supply such as a battery and various electronic devices mounted in the vehicle via the wiring member W or the like. The electrical junction box 10 distributes electric power supplied from a power supply to various electronic devices in the vehicle. The electrical junction box 10 may also be referred to as a junction box, a fuse box, a relay box, or the like, but these are collectively referred to as an electrical junction box in the present embodiment. In each drawing, a part of the electrical junction box 10 is taken out and schematically illustrated.

As illustrated in FIGS. 1 to 4, the electrical junction box 10 of the embodiment includes a heat generating component 11 and a cooling unit 12. Although not clearly illustrated in the drawing, in the electrical junction box 10, the heat generating component 11 and the cooling unit 12 are housed in a resin case.

The heat generating component 11 is a component that generates heat following energization. In the present embodiment, the heat generating component 11 is a relay 1 and a bus bar 2. The heat generating component 11 may be an electronic component such as a connector, a fuse, a capacitor, a branch portion, an electronic control unit, or an electronic component unit obtained by unitizing these components.

The cooling unit 12 cools the heat generating component 11. The cooling unit 12 includes a metal cooling plate 3, a heat transfer member 4, and a spacer 5.

The metal cooling plate 3 includes a metal plate 3*a* formed in a plate shape by a metal material. In each drawing, the metal plate 3*a* includes a rectangular plate face disposed along the length direction X and the width direction Y, facing the height direction Z. The metal plate 3*a* is formed to have a constant plate thickness in the height direction Z. The metal cooling plate 3 includes two bosses 3*b* on the plate face of metal plate 3*a* on the upper side. The boss 3*b* extends upward in the height direction Z, and a bolt 8 for fixing the heat generating component 11 is screwed into the boss 3*b* from above.

Here, as described above, the heat generating component 11 of the embodiment is the relay 1 and the bus bar 2. In the heat generating component 11, a pair of bus bars 2 is provided below the relay 1. That is, in the heat generating component 11, two bus bars 2A and 2B are connected to one relay 1. The bus bars 2A and 2B are formed in a plate shape. In each drawing, the plate faces of the bus bars 2A and 2B are disposed along the length direction X and the width direction Y, facing the height direction Z. The bus bars 2A and 2B are bent in an L shape when viewed from the height direction Z. The bus bars 2A and 2B are configured such that one end sides bent in an L shape serve as relay connection portions 2Aa and 2Ba connected to the relay 1, and the other end sides serve as wiring member connection portions 2Ab and 2Bb connected to the wiring members W. The relay 1 includes a body 1A and a fixed piece 1B. The body 1A is formed in a rectangular parallelepiped shape, and connection terminals 1Aa respectively connected to the relay connection portions 2Aa and 2Ba of the bus bars 2A and 2B are provided at the bottom (See FIGS. 3 and 4). That is, the bus bars 2A and 2B are connected to the bottom (the lower side in the height direction Z) of the body 1A of the relay 1. The fixed piece 1B is a portion through which the bolt 8 described above passes along the height direction Z. The fixed pieces 1B are provided at two positions of the body 1A and provided on the respective side portions of the body 1A to extend in opposite directions in the horizontal direction including the length direction X and the width direction Y. Therefore, by using the bolt 8 screwed into the boss 3*b* from above, the relay 1 is pressed toward the metal plate 3*a* on the lower side in the height direction z together with the bus bars 2A and 2B and is fixed to the boss 3*b*.

The heat transfer member 4 is formed of a member having insulating properties and elasticity and intervenes between the heat generating component 11 and the metal cooling plate 3. The heat transfer member 4 includes a heat transfer plate 4*a* formed in a plate shape. In each drawing, the heat transfer plate 4*a* includes a plate face disposed along the length direction X and the width direction Y, facing the height direction Z. The heat transfer plate 4*a* is formed to have a rectangular plate face substantially identical to the metal plate 3*a* of the metal cooling plate 3. The heat transfer plate 4*a* is formed to have a constant plate thickness in the height direction Z. The heat transfer member 4 includes two through holes 4*b* passing through the heat transfer plate 4*a* along the height direction Z. The through hole 4*b* is a portion into which the boss 3*b* of the metal cooling plate 3 inserted. The heat transfer member 4 is positioned by the bosses 3*b* respectively inserted into the through holes 4*b* in a state where the heat generating component 11 is fixed to the bosses 3*b*. The plate face of the heat transfer plate 4*a* on the lower side is disposed in contact with the plate face of the metal plate 3*a* on the upper side. The heat transfer member 4 includes a plurality of receiving holes 4*c* passing through the heat transfer plate 4*a* along the height direction Z. The plurality of receiving holes 4*c* are provided side by side so as to be disposed below the plate faces of the bus bars 2A and 2B along the L shape of the bus bars 2A and 2B while the heat generating component 11 is fixed to the boss 3*b*. In the embodiment, the receiving hole 4*c* has a rectangular hole shape and passes through the heat transfer plate 4*a*. The hole shape of the receiving hole 4*c* is not limited to a rectangular shape and may be various shapes.

Figure 3:
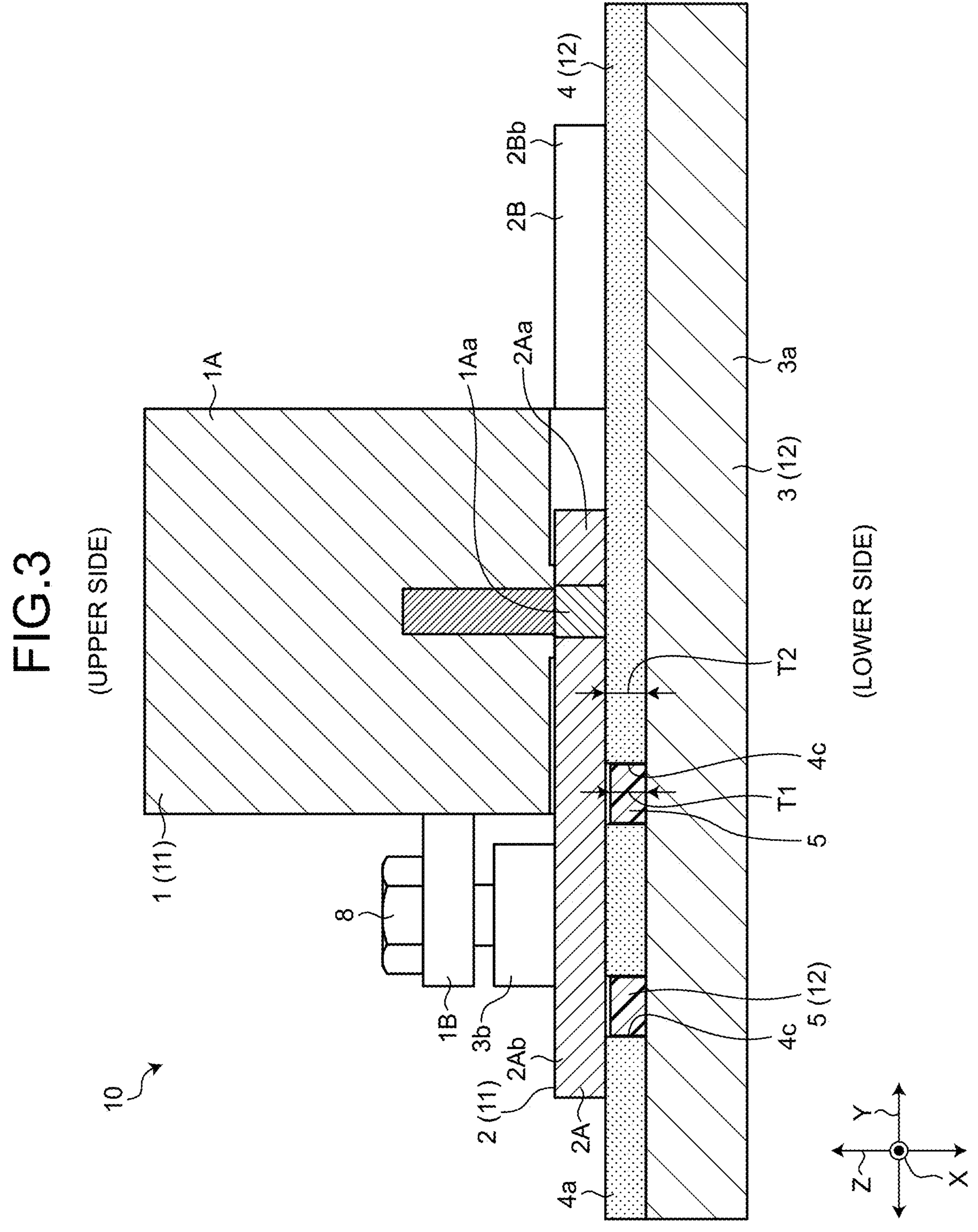
FIG. 3 is a sectional view of the electrical junction box according to the embodiment in the middle of assembly.
Figure 4:
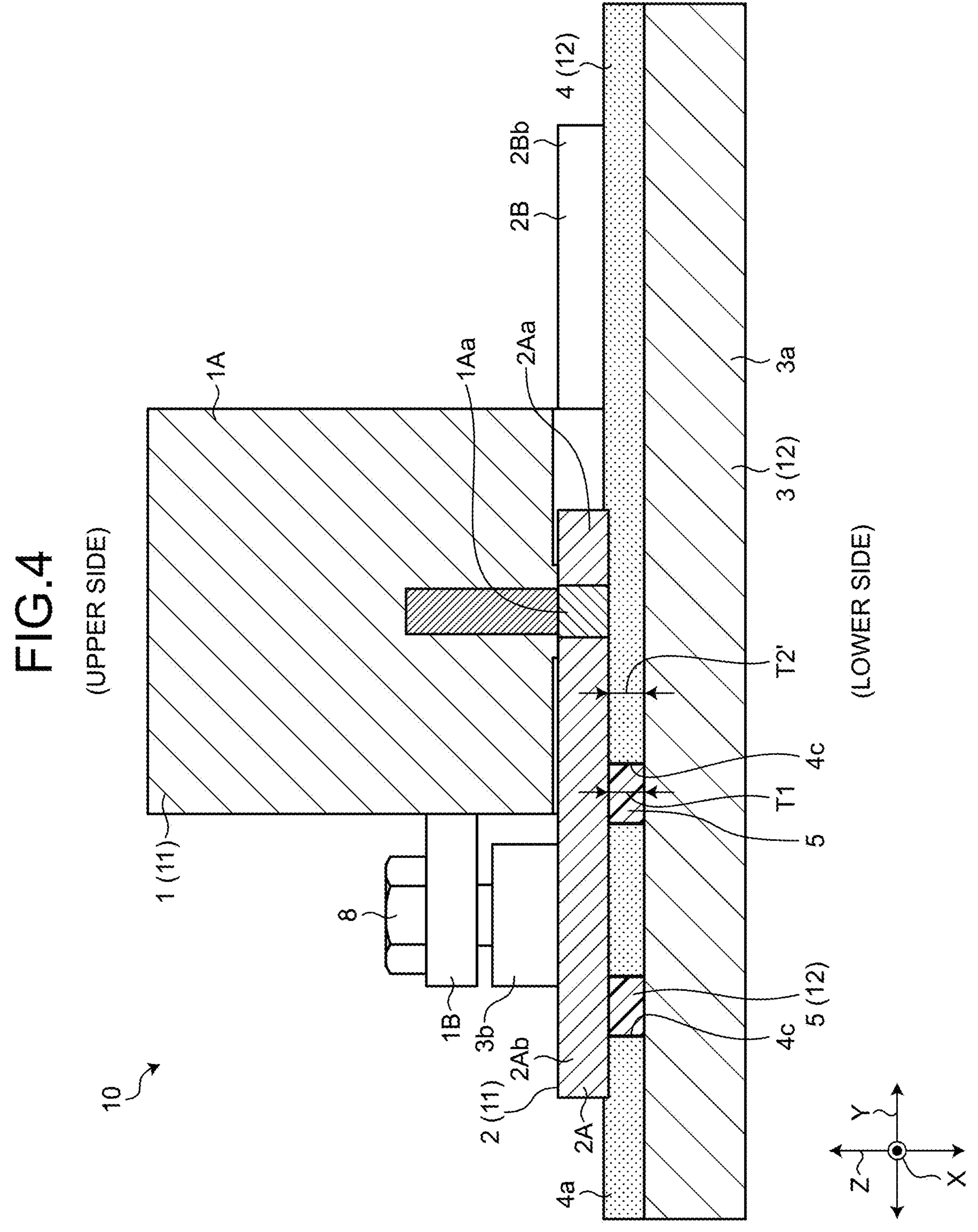
FIG. 4 is a sectional view of the electrical junction box according to the embodiment in an assembled state.

The spacer 5 has insulating properties and is formed of a member having hardness equal to or higher than that of the heat generating component 11 (the bus bar 2) and the metal plate 3*a*. For example, the spacer 5 is formed of a resin material. The spacer 5 is inserted and received in the receiving hole 4*c* of the heat transfer member 4. The spacer 5 is formed in the same shape as the hole shape of the receiving hole 4*c*. Therefore, in a state of being inserted into the receiving hole 4*c*, the spacer 5 is received so as not to elastically deform the heat transfer member 4 in a direction intersecting the height direction z that is the pass-through direction of the receiving hole 4*c*. As illustrated in FIGS. 3 and 4, in the assembly of the electrical junction box 10, the spacer 5 is received in the receiving hole 4*c* of the heat transfer member 4 and is provided so as to pass through the heat transfer member 4 and be contactable with the heat generating component 11 (the bus bar 2) and the metal plate 3*a*. Therefore, the spacer 5 intervenes between the heat generating component 11 (the bus bar 2) and the metal plate 3*a* together with the heat transfer member 4. As illustrated in FIGS. 3 and 4, the spacer 5 has an intervening dimension T1 in the height direction Z that is a dimension of the spacer 5, together with the heat transfer member 4, intervening between the heat generating component 11 (the bus bar 2) and the metal plate 3*a*.

Figure 2:
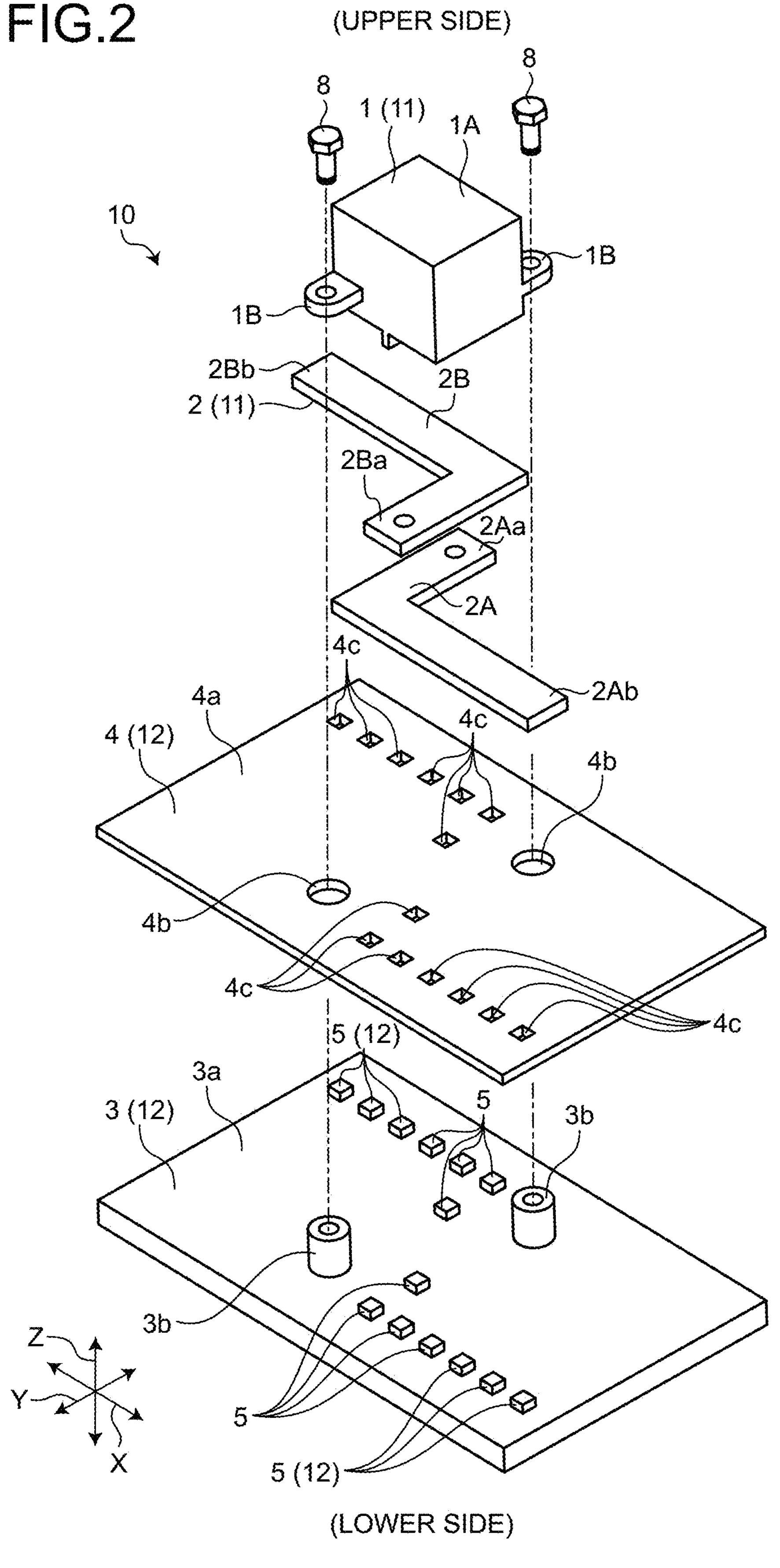
FIG. 2 is an exploded perspective view of the electrical junction box according to the embodiment.

As illustrated in FIG. 2, in the electrical junction box 10 configured as described above, the metal cooling plate 3, the heat transfer member 4, and the heat generating component 11 are overlapped in this order from the lower side along the height direction Z. As illustrated in FIG. 3, in the electrical junction box 10, the spacer 5 is received in the receiving hole 4*c* of the heat transfer member 4. In the electrical junction box 10 in this state, as illustrated in FIG. 3, the bolt 8 is passed through the fixed piece 1B of the relay 1 from above and is screwed into the boss 3*b* of the metal cooling plate 3. In the electrical junction box 10, as illustrated in FIG. 4, the bolt 8 is screwed into the boss 3*b* until the plate face on the upper side of the metal plate 3*a* of the metal cooling plate 3 and the plate-shaped lower face of the heat generating component 11 (the bus bar 2) come into contact with the spacer 5. Therefore, in the electrical junction box 10, the interval between the plate face on the upper side of the metal plate 3*a* of the metal cooling plate 3 and the plate-shaped lower face of the heat generating component 11 (the bus bar 2) is maintained at the intervening dimension T1 of the spacer 5 intervening therebetween. At this time, the heat transfer member 4 is elastically compressed between the heat generating component 11 (the bus bar 2) and the metal plate 3*a* and comes into contact with the plate face on the upper side of the metal plate 3*a* of the metal cooling plate 3 and the plate-shaped lower face of the heat generating component 11 (the bus bar 2). As illustrated in FIG. 3, in the free condition before being compressed, an intervening dimension T2 of the heat transfer member 4 intervening between the plate face on the upper side of the metal plate 3*a* of the metal cooling plate 3 and the plate-shaped lower face of the heat generating component 11 (the bus bar 2) exceeds the intervening dimension T1 of the spacer 5. As illustrated in FIG. 4, the heat transfer member 4 in a compressed condition has an intervening dimension T2' equivalent to the intervening dimension T1 of the spacer 5. In this condition, the spacer 5 passes through the heat transfer member 4 via the receiving hole 4*c* and is brought into contact with the plate face on the upper side of the metal plate 3*a* of the metal cooling plate 3 and the plate-shaped lower face of the heat generating component 11 (the bus bar 2).

In such an electrical junction box 10, as illustrated in FIG. 4, the plate faces of the heat transfer plate 4*a* of the heat transfer member 4 respectively come into close contact with the plate face on the upper side of the metal plate 3*a* of the metal cooling plate 3 and the plate-shaped lower face of the heat generating component 11 (the bus bar 2). As a result, heat transfer performance is enhanced. In the electrical junction box 10, the predetermined interval between the plate face on the upper side of the metal plate 3*a* of the metal cooling plate 3 and the plate-shaped lower face of the heat generating component 11 (the bus bar 2) is maintained by the spacer 5, and the insulation distance at which the heat transfer plate 4*a* of the insulating heat transfer member 4 intervenes is maintained.

As described above, the electrical junction box 10 of the embodiment includes the heat generating component 11 and the cooling unit 12 that cools the heat generating component 11. The cooling unit 12 includes: the metal cooling plate 3; the heat transfer member 4 having insulating properties and intervening between the heat generating component 11 and the metal cooling plate 3; and the spacer 5 having insulating properties and being in contact with the heat generating component 11 and the metal cooling plate 3 to maintain a predetermined interval between the heat generating component 11 and the metal cooling plate 3.

The wire harness WH of the embodiment includes the wiring member W having electrical conductivity and the electrical junction box 10 electrically connected to the wiring member W. The electrical junction box 10 includes the heat generating component 11 and the cooling unit 12 that cools the heat generating component 11. The cooling unit 12 includes: the metal cooling plate 3; the heat transfer member 4 having insulating properties and intervening between the heat generating component 11 and the metal cooling plate 3; and the spacer 5 having insulating properties and being in contact with the heat generating component 11 and the metal cooling plate 3 to maintain a predetermined interval between the heat generating component 11 and the metal cooling plate 3.

According to the electrical junction box 10 and the wire harness WH, a predetermined interval is maintained between the heat generating component 11 and the metal cooling plate 3 by the spacer 5, and the heat transfer member 4 intervenes at the predetermined interval. Therefore, the electrical junction box 10 and the wire harness WH of the embodiment can maintain the insulation distance by the heat transfer member 4. As a result, the electrical junction box 10 and the wire harness WH of the embodiment can appropriately have cooling performance.

In the electrical junction box 10 and the wire harness WH of the embodiment, the heat transfer member 4 has the intervening dimension T2 exceeding the intervening dimension T1 of the spacer 5 in the free condition, and is elastically compressed in a condition of intervening between the heat generating component 11 and the metal cooling plate 3.

According to the electrical junction box 10 and the wire harness WH, the heat transfer member 4 is brought into close contact with the heat generating component 11 and the metal cooling plate 3 while being disposed at a predetermined interval between the heat generating component 11 and the metal cooling plate 3 due to the intervening dimension T1 of the spacer 5. Therefore, in the electrical junction box 10 and the wire harness WH of the embodiment, the compressibility of the heat transfer member 4 is maintained due to the intervening dimension T1 of the spacer 5, a situation in which the heat transfer member 4 reaches a compression limit during vibration can be prevented, and the durability of the heat transfer member 4 can be improved. As a result, the electrical junction box 10 and the wire harness WH of the embodiment can improve the cooling effect by the heat transfer member 4.

In the electrical junction box 10 and the wire harness WH of the embodiment, the heat transfer member 4 is formed by passing the receiving hole 4*c*, into which the spacer 5 is inserted, through the heat transfer member 4, and the spacer 5 is provided in contact with the heat generating component 11 and the metal cooling plate 3 through the receiving hole 4*c*.

According to the electrical junction box 10 and the wire harness WH, the insulation distance provided by the heat transfer member 4 can be maintained by the spacer 5 in the area surrounding the receiving hole 4*c*. As a result, the electrical junction box 10 and the wire harness WH of the embodiment can have an appropriate insulating properties by passing the receiving hole 4*c* through the heat transfer member 4 to which insulating properties are to be imparted (e.g., a position corresponding to heat generating component 11 (bus bar 2)) at a desired position, and by inserting the spacer 5 thereinto.

Note that the above-described electrical junction box 10 and wire harness WH according to the embodiment of the present invention is not limited to the above-described embodiment, and various modifications can be made within the scope recited in the claims. The electrical junction box 10 and wire harness WH according to the present embodiment may be configured by appropriately combining the constituent elements of the embodiment and the modifications described above.

The electrical junction box and the wire harness according to the present embodiment can appropriately have cooling performance.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical junction box comprising:

a heat generating component that includes a bus bar having an L shape that includes a first end side that extends in a length direction of the electrical junction box and a second end side that extends in a width direction of the electrical junction box; and a cooling unit configured to cool the heat generating component, wherein the cooling unit includes: a metal cooling plate; a heat transfer member having insulating properties and intervening between the heat generating component and the metal cooling plate; and a spacer having insulating properties, being in contact with the heat generating component and the metal cooling plate, and maintaining a predetermined interval between the heat generating component and the metal cooling plate, wherein the first end side of the bus bar is disposed over the spacer.

2. The electrical junction box according to claim 1, wherein the heat transfer member in a free condition has an intervening dimension exceeding an intervening dimension of the spacer, and the heat transfer member is elastically compressed in a condition of intervening between the heat generating component and the metal cooling plate.

3. The electrical junction box according to claim 1, wherein the heat transfer member is formed by passing a receiving hole, into which the spacer is inserted, through the heat transfer member, and the spacer is provided in contact with the heat generating component and the metal cooling plate through the receiving hole.

4. The electrical junction box according to claim 2, wherein the heat transfer member is formed by passing a receiving hole, into which the spacer is inserted, through the heat transfer member, and the spacer is provided in contact with the heat generating component and the metal cooling plate through the receiving hole.

5. A wire harness comprising:

a wiring member having electrical conductivity; and an electrical junction box electrically connected to the wiring member, wherein the electrical junction box includes a heat generating component that includes a bus bar having an L shape that includes a first end side that extends in a length direction of the electrical junction box and a second end side that extends in a width direction of the electrical junction box, and a cooling unit configured to cool the heat generating component, and the cooling unit includes: a metal cooling plate; a heat transfer member having insulating properties and intervening between the heat generating component and the metal cooling plate; and a spacer having insulating properties, being in contact with the heat generating component and the metal cooling plate, and maintaining a predetermined interval between the heat generating component and the metal cooling plate, wherein the first end side of the bus bar is disposed over the spacer.

* * * * *